United States Patent
Ueno et al.

(10) Patent No.: US 7,710,301 B2
(45) Date of Patent: May 4, 2010

(54) DIGITAL/ANALOG CONVERTER AND TRANSMITTER FOR COMPLEX SIGNALS

(75) Inventors: Takeshi Ueno, Kawasaki (JP); Takafumi Yamaji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 11/755,872

(22) Filed: May 31, 2007

(65) Prior Publication Data

US 2007/0279269 A1    Dec. 6, 2007

(30) Foreign Application Priority Data

May 31, 2006    (JP)    ............... 2006-152479

(51) Int. Cl.
*H03M 1/66*    (2006.01)

(52) U.S. Cl. ........................ 341/144; 375/297

(58) Field of Classification Search .......... 341/144–170
See application file for complete search history.

(56) References Cited

U.S. PATENT DOCUMENTS

| | | | | |
|---|---|---|---|---|
| 4,857,906 | A * | 8/1989 | Conner | 345/97 |
| 6,417,793 | B1 * | 7/2002 | Bugeja et al. | 341/144 |
| 6,760,448 | B1 * | 7/2004 | Gundry | 381/23 |
| 7,006,020 | B2 * | 2/2006 | Liu et al. | 341/68 |
| 7,061,414 | B2 * | 6/2006 | Chen et al. | 341/137 |
| 7,068,199 | B2 * | 6/2006 | Preisach | 341/144 |
| 7,081,793 | B2 * | 7/2006 | Morris et al. | 330/10 |
| 7,098,830 | B2 * | 8/2006 | Lin et al. | 341/144 |
| 7,123,175 | B2 * | 10/2006 | Katakura et al. | 341/112 |
| 7,224,304 | B2 * | 5/2007 | Schoner | 341/144 |
| 7,227,482 | B2 * | 6/2007 | San et al. | 341/143 |
| 2007/0024359 | A1 | 2/2007 | Yamaji et al. | |
| 2007/0026835 | A1 | 2/2007 | Yamaji et al. | |
| 2007/0194971 | A1 | 8/2007 | Yamaji et al. | |

FOREIGN PATENT DOCUMENTS

| | | |
|---|---|---|
| JP | 07-066726 | 3/1995 |
| JP | 07-131496 | 5/1995 |
| JP | 2001-285386 | 10/2001 |
| JP | 2002-164789 | 6/2002 |
| JP | 2005-286552 | 10/2005 |

OTHER PUBLICATIONS

Porra et al, Low Voltage Circuits for a Single Chip 2GHZ Transceiver for Mobile Telecommunication, 1996, Proc. ISCAS, vol. 1, pp. 492-495.

Japanese Office Action dated May 7, 2008 corresponding to U.S. Appl. No. 11/755,872, filed May 31, 2007.

* cited by examiner

*Primary Examiner*—Lam T Mai
(74) *Attorney, Agent, or Firm*—Turocy & Watson, LLP

(57) ABSTRACT

According to an embodiment of the invention, there is provided a digital/analog converter includes: a decoder that converts a (n−1)-phase input digital signal to a n-phase output digital signal; and a signal generating unit that generates analog signals according to the n-phase output digital signal.

12 Claims, 9 Drawing Sheets

＃ DIGITAL/ANALOG CONVERTER AND TRANSMITTER FOR COMPLEX SIGNALS

CROSS-REFERENCE TO RELATED APPLICATIONS

This application is based upon and claims the benefit of priority from Japanese Patent Application No. 2006-152479, filed May 31, 2006, the entire contents of which are incorporated herein by reference.

BACKGROUND

1. Field

The present invention relates to a digital/analog (D/A) converter that converts a digital signal to an analog signal.

2. Description of the Related Art

In a signal processing in radio communication, the amplitude and phase of a signal are operated and thus there is often used a two-dimensional orthogonal signal of In-phase/Quadrature-phase (I/Q). Therefore, as disclosed in Porra, V., Halonen, K., Koli, K., Paakonen, M., Siilasto, S., Tiiliharju, E., Tolonen, P. and Wahlroos, T., "Low voltage circuits for a single chip 2 GHz transceiver for mobile telecommunication", International Symposium on Circuits and Systems, Vol. 1, pages 492-495 (12-15 May, 1996), a D/A converter in a radio transmitter generally operates two signals of I/Q signals.

Also, to output I/Q analog signals as differential signals respectively, as shown in FIG. 10, generally, a two-phase D/A converter is used for an I signal and another two-phase D/A converter is used for the Q signal. In FIG. 10, the analog value of the I digital signal is obtained by a difference between OUT I+ and OUT I−, while the analog value of a Q digital signal is obtained by a difference between OUT Q+ and OUT Q−.

As in the technique described above, when two differential output type D/A converters are used, conversion accuracies of the two converters do not coincide with each other because of a matching error between the two D/A converters. Also, when there are provided the two independent differential output type D/A converts, the chip area and power consumption thereof unfavorably increase. And, when a load is provided as an external load, the number of parts increases.

SUMMARY

According to an aspect of the invention, there is provided a D/A converter that operates multi-dimensional signals such as a complex signal with high accuracy without causing increases in the chip area, the power consumption and the number of parts.

According to an aspect of the invention, there is provided a digital/analog converter includes: a decoder that converts a (n−1)-phase input digital signal to a n-phase output digital signal; and a signal generating unit that generates analog signals according to the n-phase output digital signal.

DETAILED DESCRIPTION

A general architecture that implements the various feature of the invention will now be described with reference to the drawings.

Principle

Figure 1:
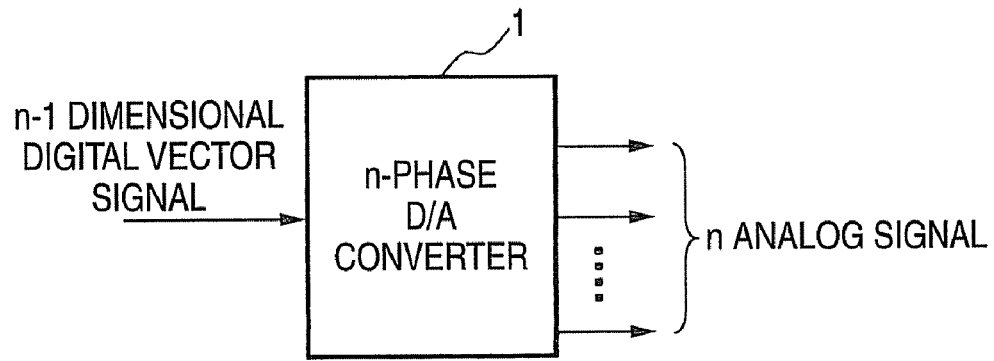
FIG. 1 is a block diagram of a n-phase output D/A converter.

The n-phase output D/A converter 1 as shown in FIG. 1 receives a digital vector signal which expresses n−1 dimension values in the form of (n−1)-phase signal, converts the digital vector signal to n analog signals respectively expressing the n phases, and outputs the n analog signals. A sum of the n analog signals is controlled to be a substantially constant. Therefore, the common-mode component of the output signals is 0.

(In a Case of n=3)

Figure 2:
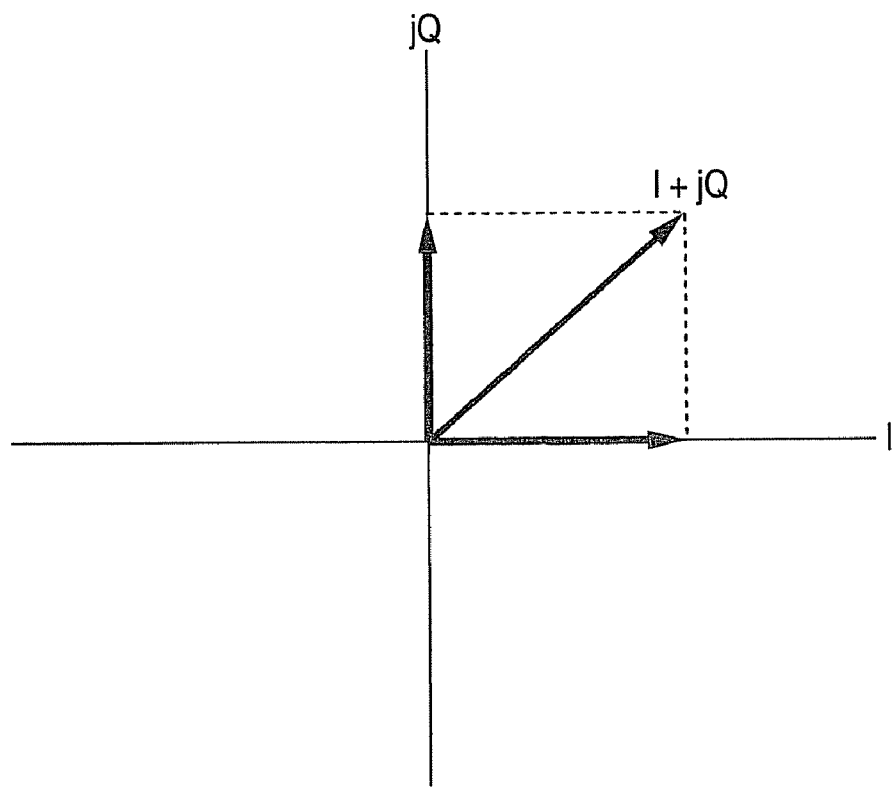
FIG. 2 is a view of a complex plane.
Figure 3:
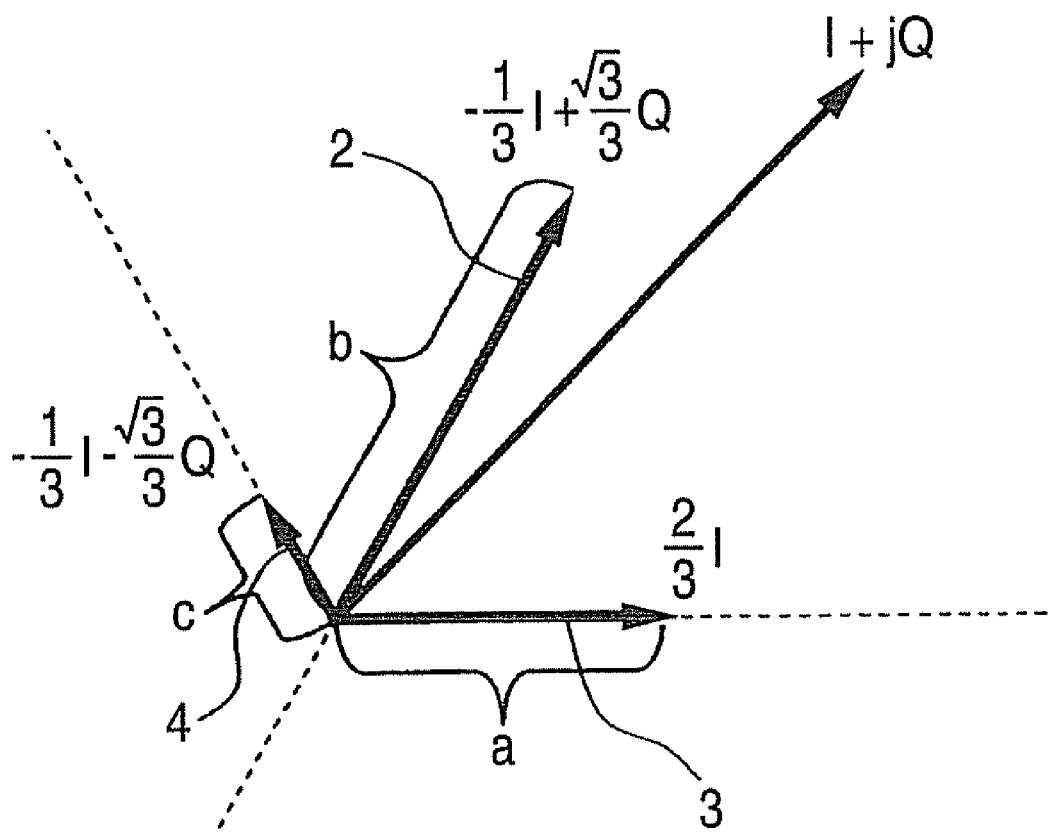
FIG. 3 is a view of a two-phase signal and a three-phase signal which express a complex signal.

Now, for simplification of explanation, description will be given below of the case where n=3 with reference to FIGS. 2 and 3. FIG. 2 is a view of a general complex plane. In this figure, there is shown a composite vector I+jQ which is composed of I (which is shown by the horizontal axis) and jQ (which is shown by the vertical axis). The reference vectors of a three-phase signal are three vectors which are different by $\frac{2}{3}\pi$ from one another in phase. That is, the reference vectors are respectively shown as follows:

$$e^{j\frac{0}{3}n}, be^{j\frac{2}{3}n}, ce^{j\frac{4}{3}n}. \quad (1)$$

When the complex signal I+jQ shown in FIG. 2 is expressed using the three reference vectors, following equation (2) is obtained.

$$I + jQ = ae^{j\frac{0}{3}n} + be^{j\frac{2}{3}n} + ce^{j\frac{4}{3}n}. \quad (2)$$

Here, a, b and c are coefficients which are respectively expressed by scalar amounts. Thus, according to the condition that the common-mode signal component is 0, there is obtained a+b+c=0. Therefore, when the equation (2) is solved about a, b, c, under the condition of a+b+c=0, there is found the following equation (3):

$$\begin{bmatrix} a \\ b \\ c \end{bmatrix} = \frac{1}{3}\begin{bmatrix} 2 & 0 \\ -1 & \sqrt{3} \\ -1 & -\sqrt{3} \end{bmatrix}\begin{bmatrix} I \\ Q \end{bmatrix}. \quad (3)$$

Accordingly, the two-phase signal expressing the complex signal of I/Q (two-dimension value) is converted to a three-phase signal which is defined by a, b, c. FIG. 3 shows first to third-phase signals 2, 3, 4 which are obtained when the complex signal I+jQ shown in FIG. 2 is converted according to the equation (3). Although variables of the three-phase signal are to be three (a, b, c), a degree of freedom of the three-phase signal is two due to the condition, a+b+c=0. Similarly, a degree of freedom of a signal that is outputted by an ordinary n-phase output D/A converter is n−1.

As described below, by using a three-phase signal, a complex signal can be expressed by a single D/A converter.

In the above-mentioned description, there are shown an example in which the three reference vectors are different by $\frac{2}{3}\pi$ from one another. However, it goes without saying that the present invention is not limited to this.

(In the Case of n=4)

Figure 4:
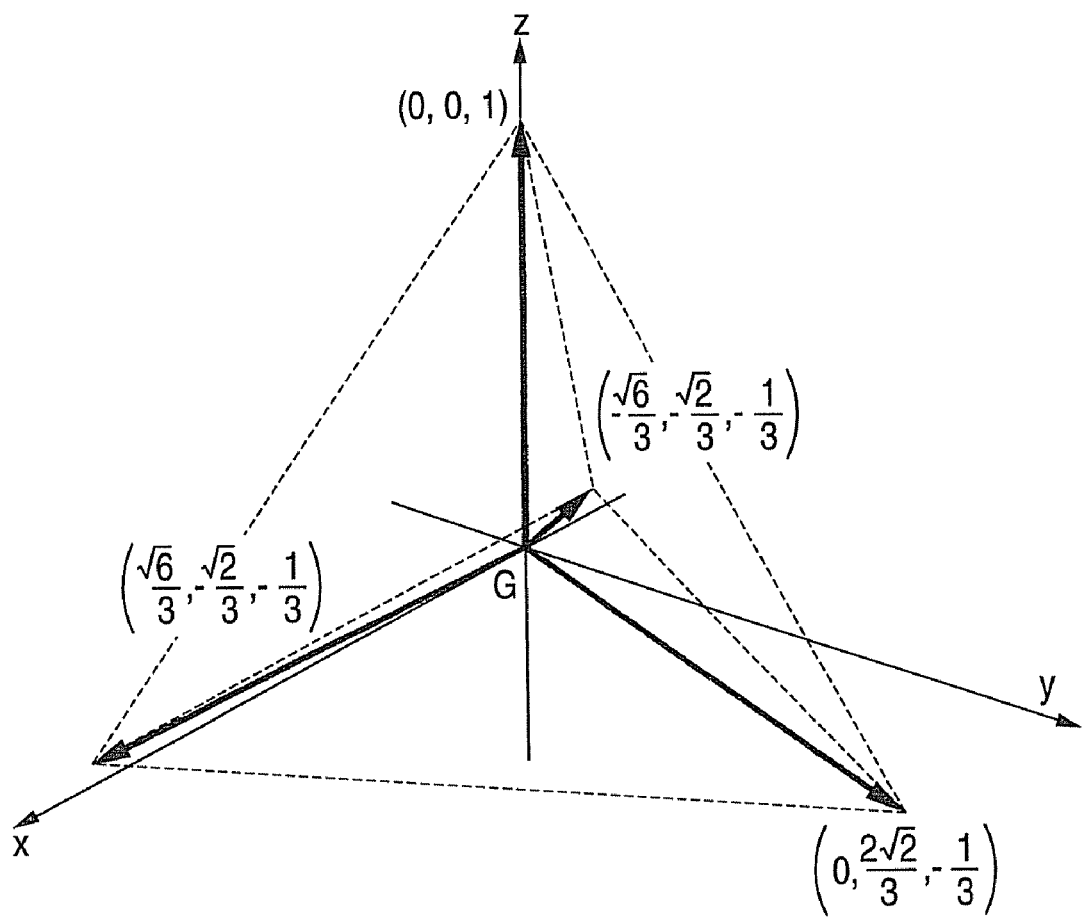
FIG. 4 is a view of a three-phase signal and a four-phase signal which express a three-dimensional signal.

In the case of n=4, as shown in FIG. 4, a three-dimensional signal is expressed while four directions respectively extending from the center of gravity G of a regular tetrahedron toward the respective vertexes of the regular tetrahedron are used as reference vectors (shown by thick solid lines). When these four reference vectors are shown by three-dimensional orthogonal coordinates (x, y, z), there is obtained the following equation (4):

$$\left(0, \frac{2\sqrt{2}}{3}, -\frac{1}{3}\right), \left(-\frac{\sqrt{6}}{3}, -\frac{\sqrt{2}}{3}, -\frac{1}{3}\right), \left(\frac{\sqrt{6}}{3}, -\frac{\sqrt{2}}{3}, -\frac{1}{3}\right), (0, 0, 1). \quad (4)$$

When an arbitrary three-dimension signal (x, y, z) expressed by three-dimension orthogonal coordinates is expressed by these four reference vectors (that is, in four phases), there is obtained the following equation (5):

$$\begin{bmatrix} x \\ y \\ z \end{bmatrix} = \begin{bmatrix} 0 & -\frac{\sqrt{6}}{3} & \frac{\sqrt{6}}{3} & 0 \\ \frac{2\sqrt{2}}{3} & -\frac{\sqrt{2}}{3} & -\frac{\sqrt{2}}{3} & 0 \\ -\frac{1}{3} & -\frac{1}{3} & -\frac{1}{3} & 1 \end{bmatrix} \begin{bmatrix} a \\ b \\ c \\ d \end{bmatrix}. \quad (5)$$

Here, a, b, c and d are coefficients which are respectively expressed by scalar amounts.

When the equation (5) is solved similarly to the case of n=3 under the condition that the common-mode component is 0, that is, under the condition that a+b+c+d=0, there is obtained the following equation (6):

$$\begin{bmatrix} a \\ b \\ c \\ d \end{bmatrix} = \begin{bmatrix} 0 & \frac{\sqrt{2}}{2} & -\frac{1}{4} \\ -\frac{\sqrt{6}}{4} & -\frac{\sqrt{2}}{4} & -\frac{1}{4} \\ \frac{\sqrt{6}}{4} & -\frac{\sqrt{2}}{4} & -\frac{1}{4} \\ 0 & 0 & \frac{3}{4} \end{bmatrix} \begin{bmatrix} x \\ y \\ z \end{bmatrix}. \quad (6)$$

Thus, a three-phase signal which expresses a three-dimensional signal (x, y, z), is converted to a four-phase signal which is defined by a, b, c, and d.

In this manner, since use of a four-phase signal allows the expression of three-dimension vectors, the 4-phase output D/A converter can be applied to a device such as a sonar which applies beams in a three-dimensional direction.

In the above-mentioned description, there are shown an example in which a two-dimensional value is expressed by three phases and an example in which a three-dimensional value is expressed by four phases. However, it goes without saying that the present invention is not limited to this.

Now, description will be given below of the mode for carrying out the above-mentioned principle of the two-phase input, expressing a two-dimensional value, and three-phase output. Of course, when a n− (n is integer and two or more) dimensional value is operated, an equation for converting a (n−1)-phase input expressing a (n−1) dimension to a n-phase output may be loaded into the decoder, and there may be additionally provided n analog signal generating circuits which corresponds to the number of output phases.

First Embodiment

Figure 5:
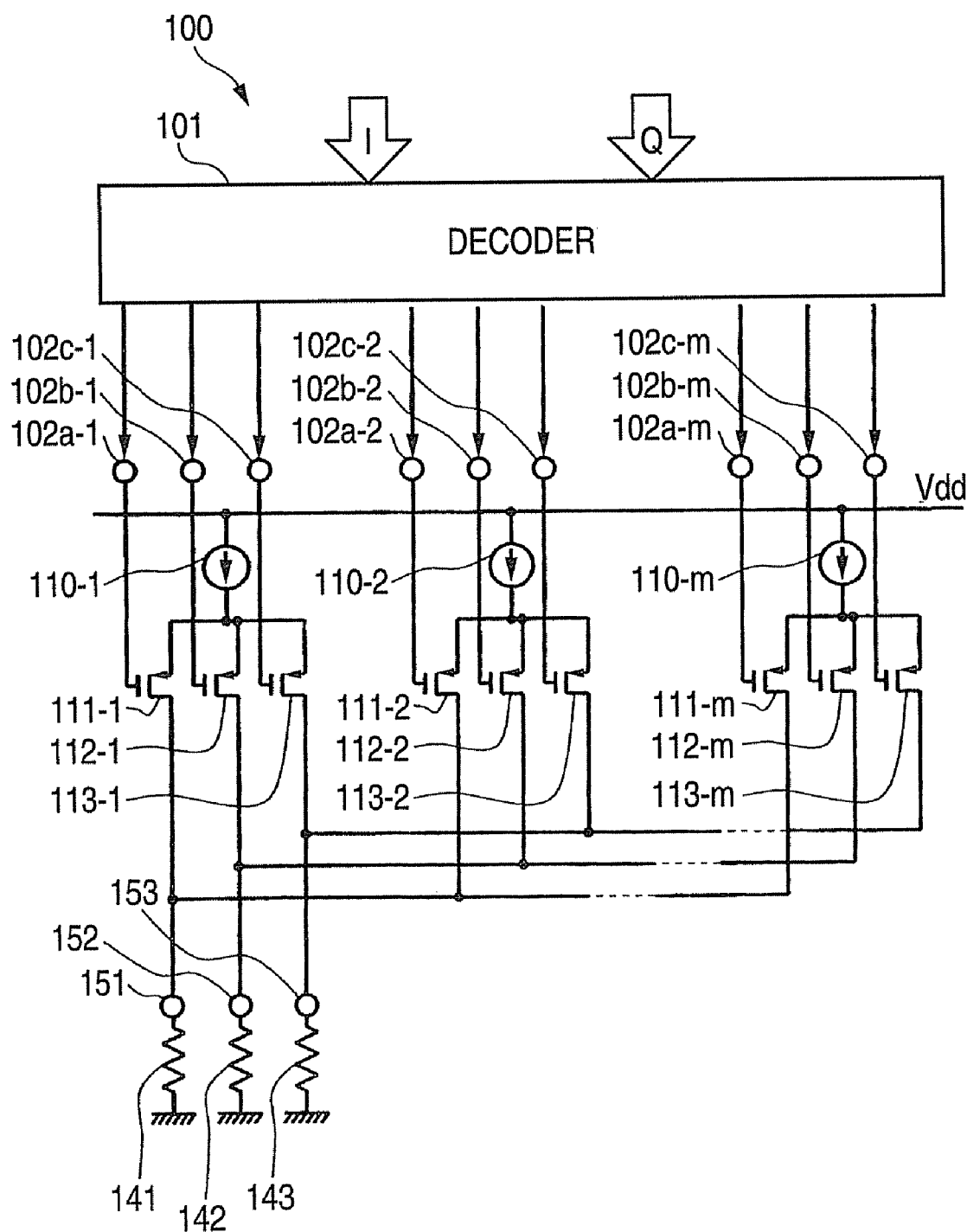
FIG. 5 is a circuit diagram of a D/A converter according to a first embodiment of the invention.

FIG. 5 is a circuit diagram of a D/A converter 100 which is a current-steering type with two-phase input three-phase output according to a first embodiment of the present invention.

The D/A converter 100 according to the first embodiment includes: a decoder 101; constant-current sources 110-1, 110-2, . . . , 110-*m*; FET-type transistors 111-1, 112-1, 113-1, 111-2, 112-2, 113-2, . . . , 111-*m*, 112-*m*, 113-*m*; resistors 141, 142, 143; and analog output terminals 151, 152, 153.

The transistors 111-1, 111-2, . . . , 111-*m* and resistor 141 cooperate together in constituting an analog voltage generating circuit corresponding to one phase. Also, the transistors 112-1, 112-2, . . . , 112-*m* and resistor 142 cooperate together in constituting an analog voltage generating circuit (signal generating circuit) corresponding to another one phase. Further, the transistors 113-1, 113-2, . . . , 113-*m* and resistor 143 constitute an analog voltage generating circuit corresponding to still another one phase. The constant-current sources 110-1, 110-2, . . . , 110-*m* are used in common in the respective analog voltage generating circuits.

The decoder 101 decodes a two-phase m bit digital input signal expressing a two-dimensional signal (I, Q) inputted therein to a three-phase m bit digital signal of a negative logic binary code. The decoder 101 converts the two-phase digital input signal so that the sum of three m bit digital signal values to be outputted simultaneously is a substantially constant value.

The decoder 101 is realized by a digital circuit which satisfies, for example, the equation (3).

However, since the respective analog output signals do not have a value less than 0, which are obtained when minimum values of the values a, b and c obtained according to the equation (3) are subtracted from values a, b, c, provide the three-phase m bit digital signal.

Of the three-phase digital signal that is outputted as the negative logic binary codes, the values of respective bits of digital values in a certain phase (which is hereinafter referred to as a first phase), that is, a first bit value, a second bit value, . . . , and m bit value are outputted in the order starting from the lowest bit from their associated output terminals 102*a*-1, 102*a*-2, . . . , and 102*a*-*m* respectively. Similarly, the values of the respective bits of digital values in another phase of the three phases than the above-mentioned phase (which is hereinafter referred to as a second phase), that is, a first bit value, a second bit value, . . . , and m bit value are outputted in the order starting from the lowest bit from their associated output terminals 102*b*-1, 102*b*-2, . . . , and 102*b*-*m* respectively. Further, similarly, the values of the respective bits of digital values in the remaining phase of the three phases (which is hereinafter referred to as a third phase), that is, a first bit value, a second bit value, . . . , and m bit value are outputted in the order starting from the lowest bit from their associated output terminals $102c$-1, $102c$-2, . . . , and $102c$-$m$, respectively. The values of the bits outputted from these output terminals serve as control signals of the respective transistors.

The constant-current sources 110-1, 110-2, . . . , and 110-$m$ are respectively connected to a common power supply having a voltage Vdd and output output currents I1 to Im respectively. The intensities of the respective output currents I1 to Im correspond to the respective orders of the m bit. That is, as in the first embodiment, when the output of the decoder 101 is a binary code, the output current I2, . . . , Im is respectively two, . . . ($2^m$–1) times as the output current I1.

The transistor 111-1 operates as a switch that controls a flow of the output current I1 to the resistor 141. The output current I1 is outputted from the constant-current source 110-1 and is inputted into the transistor 111-1 through a source terminal thereof. And also, the transistor 111-1 corresponds to the value of the first-phase lower 1 bit. To a gate terminal of the transistor 111-1, there is inputted the digital value of the first-phase lower 1 bit from the output terminal $102a$-1 of the decoder 101.

Also, the transistor 112-1 operates as a switch that controls a flow of the output current I1 to the resistor 142. The output current I1 is outputted from the constant-current source 110-1 and is inputted into the transistor 112-1 through a source terminal thereof. And also, the transistor 112-1 corresponds to the value of the second-phase lower 1 bit. To a gate terminal of the transistor 112-1, there is inputted the digital value of the second-phase lower 1 bit from the output terminal $102b$-1 of the decoder 101.

Further, the transistor 113-1 operates as a switch that controls a flow of the output current I1 to the resistor 143. The output current I1 is outputted from the constant-current source 110-1 and is inputted into the transistor 113-1 through a source terminal thereof. And also, the transistor 113-1 corresponds to the value of the third-phase lower 1 bit. To a gate terminal of the transistor 113-1, there is inputted the digital value of the third-phase lower 1 bit from the output terminal $102c$-1 of the decoder 101.

Similarly, to a gate terminal of the transistor 111-$m$, there is inputted the digital value of the first-phase lower m bit from the output terminal $102a$-$m$ of the decoder 101. Also, to a gate terminal of the transistor 112-$m$, there is inputted the digital value of the second-phase lower m bit from the output terminal $102b$-$m$ of the decoder 101. Further, to a gate terminal of the transistor 113-$m$, there is inputted the digital value of the third-phase lower m bit from the output terminal $102c$-$m$ of the decoder 101.

One end of the resistor 141 is grounded. To the other end of the resistor 141, there is inputted a sum of currents which are outputted from respective drain terminals of the transistors 111-1, 111-2, . . . , and 111-$m$. A potential difference between the two ends of the resistor 141 provides a first phase analog output signal OUTa.

Also, one end of the resistor 142 is grounded. To the other end of the resistor 142, there is inputted a sum of currents which are outputted from respective drain terminals of the transistors 112-1, 112-2, . . . , and 112-$m$. A potential difference between the two ends of the resistor 142 provides a second phase analog output signal OUTb.

Further, one end of the resistor 143 is grounded. To the other end of the resistor 143, there is inputted a sum of currents which are outputted from respective drain terminals of the transistors 113-1, 113-2, . . . , and 113-$m$. A potential difference between the two ends of the resistor 143 provides a third phase analog output signal OUTc. The resistance values of the resistors 141, 142 and 143 are set equal to each other.

The sum of currents to be outputted from the analog output terminals 151, 152 and 153 respectively provided on the other end sides of their associated resistors 141, 142 and 143 is always a substantially constant. Therefore, currents, which flow to the respective grounded ends of the resistors 141, 142 and 143, cancel each other and thus cause no change in the other currents of these three resistors. Thanks to this, it is not necessary that the analog ground provides a low impedance; for example, there is no need to provide a buffer of a high driving ability for the analog ground.

As regards the analog output voltages, since the resistors 141, 142 and 143 are configured such that their resistance values are equal to each other, similarly to the output currents, the sum of the output voltages is always a substantially constant. Thus, the common-mode component of the output signal is substantially 0.

In the first embodiment, although the equation (3) is employed in the decoder 101, the relationship between the input and output of the decoder 101 is determined in a one-meaning manner and, therefore, the decoder 101 can also be realized using a lookup table. Also, of course, it is possible to use other various means, that is, the invention is not limited to the above-mentioned embodiment.

Second Embodiment

Figure 6:
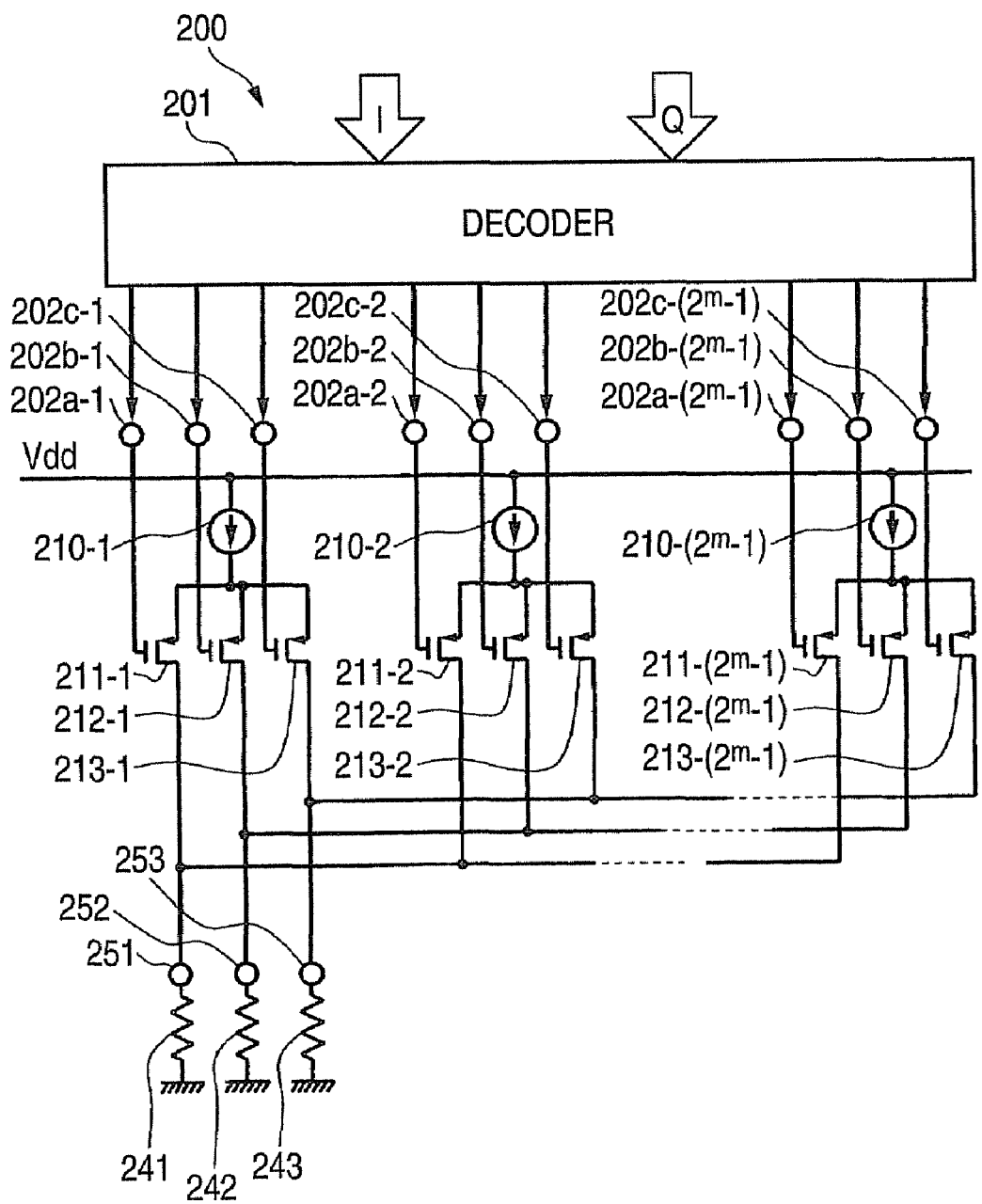
FIG. 6 is a circuit diagram of a D/A converter according to a second embodiment of the invention.

FIG. 6 is a circuit diagram of a D/A converter 200 which is a current-steering with two-phase input three-phase output according to a second embodiment of the above-mentioned principle.

A D/A converter 200 according to the second embodiment includes: a decoder 201; constant-current sources 210-1, 210-2, . . . , 210-($2^m$–1); FET-type transistors 211-1, 212-1, 213-1, 211-2, 212-2, 213-2, . . . , 211-($2^m$–1), 212-($2^m$–1), 213-($2^m$–1); resistors 241, 242, 243; and analog terminals 251, 252, 253.

The transistors 211-1, 211-2, . . . , 211-($2^m$–1), and resistor 241 cooperate together in constituting an analog voltage generating circuit corresponding to one phase. Also, the transistors 212-1, 212-2, . . . , 212-($2^m$–1), and resistor 242 cooperate together in constituting an analog voltage generating circuit corresponding to another one phase. Further, the transistors 213-1, 213-2, . . . , 213-($2^m$–1), and resistor 243 cooperate together in constituting an analog voltage generating circuit corresponding to still another one phase. Here, the constant-current sources 210-1, . . . , and 210-($2^m$–1) are used in common in the respective analog voltage generating circuits.

The decoder 201 decodes a two-phase m bit digital input signal expressing a two-dimension signal (I, Q) inputted therein to a three-phase m bit digital signal of a negative logic thermometer code. The decoder 201 converts the two-phase digital input signal so that the sum of three m bit digital signal values to be outputted simultaneously is a substantially constant value.

The decoder 201 can be realized by a digital circuit which uses, for example, the equation (3).

Of the three-phase digital signal which is outputted as the negative logic thermometer code, the value of a certain phase (which is hereinafter referred to as a first phase) of the three phases is outputted using output terminals $202a$-1 to $202a$-($2^m$–1). Specifically, for example, when a value to be outputted is 0, the potentials of the output terminals $202a$-1 to $202a\text{-}(2^m-1)$ are all set in a Hi level (the potentials which turn off the switch operations of the transistors $211\text{-}1$ to $211\text{-}(2^m-1)$, $212\text{-}1$ to $212\text{-}(2^m-1)$, ..., $213\text{-}1$ to $213\text{-}(2^m-1)$); and, when the value to be outputted is $1, 2, \ldots$, or m, of the output terminals $202a\text{-}1$ to $202a\text{-}(2^m-1)$, the potential of one output terminal, the potentials of two output terminal, ..., and the potentials of $(2^m-1)$ output terminals are set in a Lo level (the potentials which turn on the switch operations of the transistors $211\text{-}1$ to $211\text{-}(2^m-1)$, $212\text{-}1$ to $212\text{-}(2^m-1)$, ..., $213\text{-}1$ to $213\text{-}(2^m-1)$).

Similarly, the value of the other phase (which is hereinafter referred to as a second phase) than the above-mentioned first phase of the three phases is outputted using the output terminals $202b\text{-}1$ to $202b\text{-}(2^m-1)$. This means that, for example, when a value to be outputted is 0, the potentials of the output terminals $202b\text{-}1$ to $202b\text{-}(2^m-1)$ are set in the Hi level; and, when the value to be outputted is $1, 2, \ldots$, or m, of the output terminals $202b\text{-}1$ to $202b\text{-}(2^m-1)$, the potential of one output terminal, the potentials of two output terminals, ..., and the potentials of $(2^m-1)$ output terminals are set in the Lo level, respectively.

Further, similarly, the value of the remaining one phase (which is hereinafter referred to as a third phase) of the three phases is outputted using the output terminals $202c\text{-}1$ to $202c\text{-}(2^m-1)$. This means that, for example, when a value to be outputted is 0, the potentials of the output terminals $202c\text{-}1$ to $202c\text{-}(2^m-1)$ are set in the Hi level; and, when the value to be outputted is $1, 2, \ldots$, or m, of the output terminals $202c\text{-}1$ to $202c\text{-}(2^m-1)$, the potential of one output terminal, the potentials of two output terminals, ..., and the potentials of $(2^m-1)$ output terminals are set in the Lo level, respectively.

The values of bits to be outputted from these output terminals provide the control signals of the respective transistors respectively.

The constant-current sources $210\text{-}1, \ldots, 210\text{-}(2^m-1)$ are connected to a common power supply having a voltage Vdd and respectively output currents which are equal to each other.

The transistor $211\text{-}1$ operates as a switch that controls a flow of a current inputted to a source terminal of the transistor $211\text{-}1$ from the constant-current source $211\text{-}1$ to the resistor $241$. The current corresponds to the minimum unit of the first phase. A gate terminal of the transistor $211\text{-}1$ is connected to the output terminal $202a\text{-}1$ of the decoder $201$ and thus, when the transistor $211\text{-}1$ turns into the Lo level, it allows the flow of the current. Also, the transistor $212\text{-}1$ operates as a switch that controls a flow of a current inputted to the sources terminal of the transistor $212\text{-}1$ from the constant-current source $210\text{-}1$ to the resistor $242$. The current corresponds to the minimum unit of the second phase. A gate terminal of the transistor $212\text{-}1$ is connected to the output terminal $202b\text{-}1$ of the decoder $201$ and thus, when the transistor $212\text{-}1$ turns into the Lo level, it allows the flow of the current. Further, the transistor $213\text{-}1$ operates as a switch that controls a flow of a current inputted to a source terminal of the transistor $213\text{-}1$ from the constant-current source $210\text{-}1$ to the resistor $243$. The current corresponds to the minimum unit of the third phase. A gate terminal of the transistor $213\text{-}1$ is connected to the output terminal $202c\text{-}1$ of the decoder $201$ and thus, when the transistor $213\text{-}1$ turns into the Lo level, it allows the flow of the current.

Similarly, the transistor $211\text{-}(2^m-1)$ operates as a switch that controls a flow of a current inputted to a source terminal of the transistor $211\text{-}(2^m-1)$ from the constant-current source $210\text{-}(2^m-1)$ to the resistor $241$. The current corresponds to the minimum unit of the first phase. A gate terminal of the transistor $211\text{-}(2^m-1)$ is connected to the output terminal $202a\text{-}(2^m-1)$ of the decoder $201$ and thus, when the transistor $211\text{-}(2^m-1)$ turns into the Lo level, it allows the flow of the current.

Also, the transistor $212\text{-}(2^m-1)$ operates as a switch that controls a flow of a current inputted to a source terminal of the transistor $212\text{-}(2^m-1)$ from the constant-current source $210\text{-}(2^m-1)$ to the resistor $242$. The current corresponds to the minimum unit of the second phase. A gate terminal of the transistor $212\text{-}(2^m-1)$ is connected to the output terminal $202b\text{-}(2^m-1)$ of the decoder $201$ and thus, when the transistor $212\text{-}(2^m-1)$ turns into the Lo level, it allows the flow of the current.

And, the transistor $213\text{-}(2^m-1)$ operates as a switch that controls a flow of a current inputted to a source terminal of the transistor $213\text{-}(2^m-1)$ from the constant-current source $210\text{-}(2^m-1)$ to the resistor $243$. The current corresponds to the minimum unit of the third phase. A gate terminal of the transistor $213\text{-}(2^m-1)$ is connected to the output terminal $202c\text{-}(2^m-1)$ of the decoder $201$ and thus, when the transistor $213\text{-}(2^m-1)$ turns into the Lo level, it allows the flow of the current.

One end of the resistor $241$ is grounded and, to the other end of the resistor $241$, there is inputted the sum of currents which are outputted from the respective drain terminals of the transistors $211\text{-}1, 211\text{-}2, \ldots,$ and $211\text{-}(2^m-1)$. A potential difference between the two ends of the resistor $241$ provides an analog output signal OUTa of the first phase. Also, one end of the resistor $242$ is grounded and, to the other end of the resistor $242$, there is inputted the sum of currents which are outputted from the respective drain terminals of the transistors $212\text{-}1, 212\text{-}2, \ldots,$ and $212\text{-}(2^m-1)$. A potential difference between the two ends of the resistor $242$ provides an analog output signal OUTb of the second phase. Further, one end of the resistor $243$ is grounded and, to the other end of the resistor $243$, there is inputted the sum of currents which are outputted from the respective drain terminals of the transistors $213\text{-}1, 213\text{-}2, \ldots,$ and $213\text{-}(2^m-1)$. A potential difference between the two ends of the resistor $243$ provides an analog output signal OUTc of the third phase. The resistance values of the resistors $241$, $242$ and $243$ are set equal to each other.

The sum of currents to be outputted from the analog output terminals $251$, $252$ and $253$ respectively provided on the other end sides of their associated resistors $241$, $242$ and $243$ is always a substantially constant. Therefore, currents, which flow to the respective grounded ends of the resistors $241$, $242$ and $243$, cancel each other and thus cause no change in the other currents of these three resistors. Thanks to this, it is not necessary that the analog ground provides a low impedance; for example, there is no need to provide a buffer of a high driving ability for the analog ground.

As regards the analog output voltage, the resistors $241$, $242$ and $243$ are configured such that the resistance values are equal to each other and, therefore, similarly to the currents, the sum of the voltages is always a substantially constant. Thus, the common-mode component of the output signal is substantially 0.

As described above, even when the thermometer code is used as the output of the decoder $201$, the present invention can also be enforced.

By the way, in the second embodiment as well, the decoder can also be realized using a lookup table. Also, of course, there can also be used other various means and the invention is not limited to the above embodiment.

Third Embodiment

Figure 7:
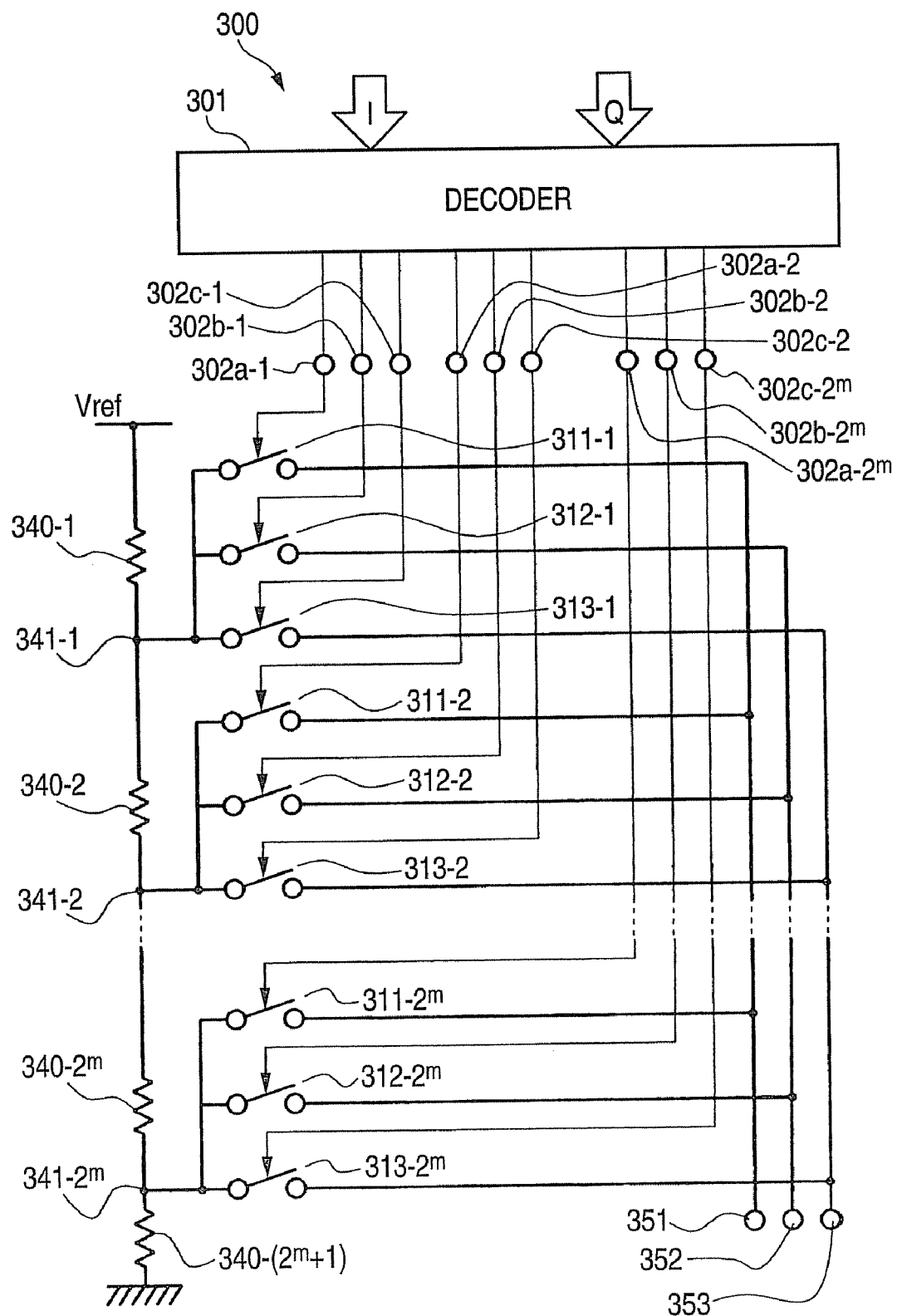
FIG. 7 is a circuit diagram of a D/A converter according to a third embodiment of the invention.

Now, FIG. 7 is a circuit diagram of a D/A converter which is resistor string type and a two-phase input three-phase output D/A converter 300 according to a third embodiment of the present of the invention.

The D/A converter 300 according to the third embodiment includes: a decoder 301; resistors 340-1, 340-2, ..., 340-($2^m$+1); switches 311-1, 311-2, ..., 311-$2^m$, 312-1, 312-2, ..., 312-$2^m$, 313-1, 313-2, ..., 313-$2^m$; analog output terminals 351, 352, 353, and taps 341-1, 341-2, ..., 341-$2^m$. Here, m is equivalent to the resolution (bit) of the output voltages of the respective analog output terminals.

The switches 311-1, 311-2, ..., and 311-$2^m$ cooperate together in constituting an analog voltage generating circuit which corresponds to one phase. Also, the switches 312-1, 312-2, ..., and 312-$2^m$ cooperate together in constituting an analog voltage generating circuit corresponding to another phase. Further, the switches 313-1, 313-2, ..., and 313-$2^m$ cooperate together in constituting an analog voltage generating circuit which corresponds to still another phase. And, the resistors 340-1, 340-2, ..., and 340-($2^m$+1) are disposed in such a manner that they can be used in common by the respective analog voltage generating circuits.

The resistors 340-1, 340-2, ..., and 340-($2^m$+1) cooperate together in constituting a resistor string. The resistance values of the resistors 340-1, 340-2, ..., and 340-($2^m$+1) are set equal to each other. From the taps 341-1, 341-2, ..., and 341-$2^m$ of the resistor string, there can be taken out a voltage which is obtained by dividing a reference voltage Vref at equal intervals. Of course, when the reference voltage Vref is a positive voltage, there are obtained voltages that is, [the voltage at the tap 341-1>the voltage at the tap 341-2>the voltage at the tap 341-$2^m$].

In FIG. 7, to one end of the resistor 340-1, there is applied the reference voltage Vref. Also, the other end of the resistor 340-1 is connected to one end of the resistor 340-2, while the connecting portion between the resistors 340-1 and 340-2 is used as the tap 341-1. And, the other end of the resistor 340-2 is connected to one end of the resistor 340-3, while the connecting portion between the two resistors is used as the tap 341-2. Similarly, the other end of the resistor 340-$2^m$ is connected to one end of the resistor 340-($2^m$+1), while the connecting portion between the two resistors is used as the tap 341-$2^m$. However, the other end of the resistor 340-($2^m$+1) is grounded.

The voltages of the taps 341-1, 341-2, ..., and 341-$2^m$ are selected by the switches 311-1, 311-2, ..., 311-$2^m$, 312-1, 312-2, ..., 312-$2^m$, 313-1, 313-2, ..., and 313-$2^m$ and are outputted to the analog output terminals 351, 352 and 353.

In FIG. 7, the respective first ends of the switches 311-1, 312-1 and 313-1 are connected to the tap 341-1. And, the respective first ends of the switches 311-2, 312-2 and 313-2 are connected to the tap 341-2. Similarly, the respective first ends of the switches 311-$2^m$, 312-$2^m$ and 313-$2^m$ are connected to the tap 341-$2^m$.

The second ends of the switches 311-1, 311-2, ..., and 311-$2^m$ are respectively connected to the analog output terminal 351. The second ends of the switches 312-1, 312-2, ..., and 312-$2^m$ are respectively connected to the analog output terminal 352. Also, the second ends of the switches 313-1, 313-2, ..., and 313-$2^m$ are respectively connected to the analog output terminal 353.

One of the switches 311-1, 311-2, ..., and 311-$2^m$ is turned on to output the voltage of a tap connected to one end of the switch from the analog output terminal 351. And, one of the switches 312-1, 312-2, ..., and 312-$2^m$ is turned on to output the voltage of a tap connected to one end of the switch from the analog output terminal 352. Also, one of the switches 313-1, 313-2, ..., and 313-$2^m$ is turned on to output the voltage of a tap connected to one end of the switch from the analog output terminal 353.

The decoder 301 decodes a two-phase m bit digital input signal expressing a two-dimension signal (I, Q) inputted therein to a three-phase m bit digital signal. The decoder 301 converts the two-phase digital input signal so that the sum of three m bit digital signal values to be outputted simultaneously is a substantially constant value.

The decoder 301 can be realized by a digital circuit which satisfies, for example, the equation (3).

Of the output terminals 302a-1, 302a-2, ..., and 302a-$2^m$, one output terminal, which corresponds to a digital value in a certain phase (which is hereinafter referred to a first phase) of a three-phase digital signal to be outputted therefrom, is turned into the Lo level, whereas the other remaining output terminals remain in the Hi level.

Similarly, of the output terminals 302b-1, 302b-2, ..., and 302b-$2^m$, one output terminal, which corresponds to a digital value in a certain phase (which is hereinafter referred to a second phase) of a three-phase digital signal to be outputted therefrom, is turned into the Lo level, whereas the other remaining output terminals remain in the Hi level.

Further similarly, of the output terminals 302c-1, 302c-2, ..., and 302c-$2^m$, one output terminal, which corresponds to a digital value in a certain phase (which is hereinafter referred to a third phase) of a three-phase digital signal to be outputted therefrom, is turned into the Lo level, whereas the other remaining output terminals remain in the Hi level.

In other words, in order to turn on only one of plural switches connected to an analog output terminal, only one of plural output terminals of the decoder 301 corresponding to a phase is turned into the Lo level and the other remaining output terminals are held in the Hi level.

The voltage levels of these output terminals provide the control signals of the respective switches. That is, the output terminal 302a-1 is connected to a control terminal of the switch 311-1 to control the on/off of the switch 311-1. Specifically, when the output terminal 302a-1 is in the Lo level, the switch 311-1 turns on and the voltage at the tap 341-1 is outputted from the analog output terminal 351. When the output terminal 302a-1 is in the Hi level, the switch 311-1 turns off and the voltage at the tap 341-1 is not outputted from the analog output terminal 351.

The output terminal 302b-1 is connected to a control terminal of the switch 311-1 to control the on/off of the switch 312-1. Specifically, when the output terminal 302b-1 is in the Lo level, the switch 312-1 turns on and the voltage at the tap 341-1 is outputted from the analog output terminal 352. When the output terminal 302b-1 is in the Hi level, the switch 312-1 turns off and the voltage at the tap 341-1 is not outputted from the analog output terminal 352.

The output terminal 302c-1 is connected to a control terminal of the switch 313-1 to control the on/off of the switch 313-1. Specifically, when the output terminal 302c-1 is in the Lo level, the switch 313-1 turns on and the voltage at the tap 341-1 is outputted from the analog output terminal 353. When the output terminal 302c-1 is in the Hi level, the switch 313-1 turns off and the voltage at the tap 341-1 is not outputted from the analog output terminal 353.

Similarly, the output terminal $302a\text{-}2^m$ is connected to a control terminal of the switch $311\text{-}2^m$ to control the on/off of the switch $311\text{-}2^m$. Specifically, when the output terminal $302a\text{-}2^m$ is in the Lo level, the switch $311\text{-}2^m$ turns on and the voltage at the tap $341\text{-}2^m$ is outputted from the analog output terminal 351. When the output terminal $302a\text{-}2^m$ is in the Hi level, the switch $311\text{-}2^m$ turns off and the voltage at the tap $341\text{-}2^m$ is not outputted from the analog output terminal 351.

And, the output terminal $302b\text{-}2^m$ is connected to a control terminal of the switch $312\text{-}2^m$ to control the on/off of the switch $312\text{-}2^m$. Specifically, when the output terminal $302b\text{-}2^m$ is in the Lo level, the switch $312\text{-}2^m$ turns on and the voltage at the tap $341\text{-}2^m$ is outputted from the analog output terminal 352. When the output terminal $302b\text{-}2^m$ is in the Hi level, the switch $312\text{-}2^m$ turns off and the voltage at the tap $341\text{-}2^m$ is not outputted from the analog output terminal 352.

Also, the output terminal $302c\text{-}2^m$ is connected to the control terminal of the switch $313\text{-}2^m$ to control the on/off of the switch $313\text{-}2^m$. Specifically, when the output terminal $302c\text{-}2^m$ is in the Lo level, the switch $313\text{-}2^m$ turns on and the voltage at the tap $341\text{-}2^m$ is outputted from the analog output terminal 353. When the output terminal $302c\text{-}2^m$ is in the Hi level, the switch $313\text{-}2^m$ turns off and the voltage at the tap $341\text{-}2^m$ is not outputted from the analog output terminal 353.

The decoder 301 selects the output terminal to be turned into the Lo level according to the equation (3) so that a sum of the values of the output digital values of the three phases is a substantially constant. As a result of this, the sum of the voltages to be outputted from the analog output terminals 351, 352 and 353 is always a substantially constant.

As described above, the present invention can be enforced even when there is employed the embodiment in which the output voltage of the decoder 301 is divided by the resistor string.

By the way, in third embodiment as well, the decoder 301 can also be realized using a lookup table. Also, it goes without saying that other various means can also be used and the present invention is not limited to the above-mentioned embodiment.

And, when the minimum output voltage of the D/A converter 300 is set for 0 and the maximum voltage thereof is set for the reference voltage Vref, the two resistors 340-1 and 340-$(2^m+1)$ can be saved; that is, the number of resistors necessary can be reduced down to $(2^m-1)$.

Fourth Embodiment

Figure 8:
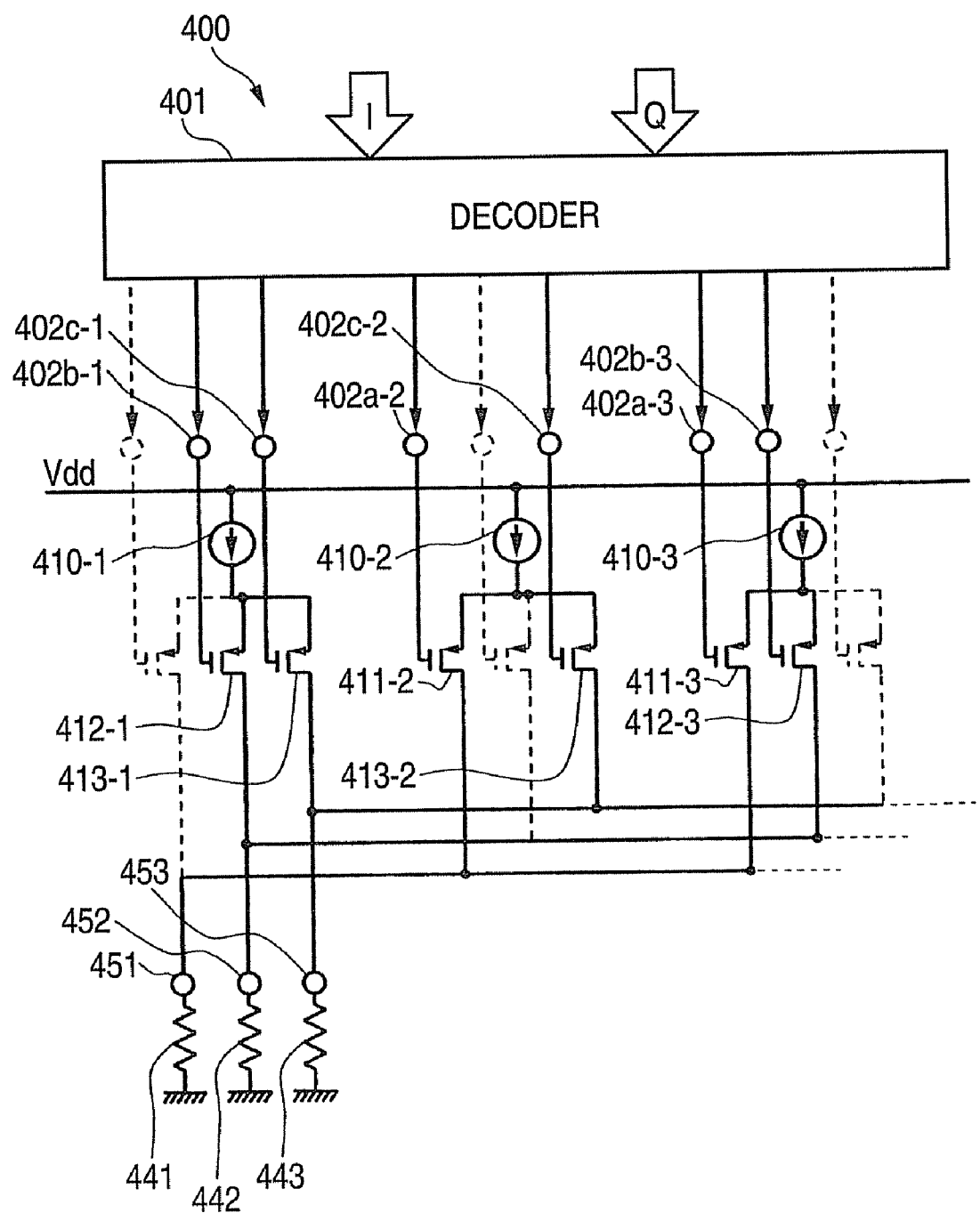
FIG. 8 is a circuit diagram of a D/A converter according to a fourth embodiment of the invention.

FIG. 8 shows a circuit diagram of D/A converter 400 which is a current-steering and two-phase input three-phase output according to a fourth embodiment of the invention.

The D/A converter 400 according to the fourth embodiment includes: a decoder 401; constant-current sources 410-1, 410-2, 410-3; plural FET-type transistors; resistors 441, 442, 443; and analog output terminals 451, 452, 453.

The constant-current source 410-1 and transistors 412-1, 413-1 cooperate together in constituting a first analog output signal generating circuit. Similarly, the constant-current source 410-2 and transistors 412-2, 413-2 cooperate together in constituting a second analog output signal generating circuit; and, the constant-current source 410-3 and transistors 412-3, 413-3 cooperate together in constituting a third analog output signal generating circuit.

While, in the second embodiment, the number of the transistors that control currents is necessary three times the number of the current sources. In the second embodiment, ⅓ of a maximum voltage at the analog output terminals corresponds to an average voltage of the three analog output terminals, that is, corresponds to a common-mode output voltage. Therefore, according to the second embodiment, it may be possible to output voltage in positive two times as that in negative with respect to the common-mode output voltage. However, it is frequent that a signal used in radio communication has same amplitude both in positive and in negative with respect to the Common-mode output. Consequently, the D/A converter according to the second embodiment has redundancy. On the other hand, according to the fourth embodiment, the number of transistors is ⅔ of the number of current sources in the D/A converter 400. That is, the number of transistors becomes ⅔ compared with the second embodiment. Each of the current sources is connected to only two output terminals through two transistors and not connected to one output terminal. In terms of one output terminal, maximum output voltage reduces to ⅔ of that in the second embodiment since ⅓ of the whole current sources are not connected to the output terminal. However, D/A converter is also useful whose output voltage is from 0 to ⅔ as ⅓ is taken as center value since it is frequent that a signal used in radio communication has same amplitude both in positive and in negative as described above. In other words, while ⅓ of transistors are saved, the size reduction of the circuit can be realized.

The constant-current sources 410-1, . . . , and 410-3 are respectively connected to a common power supply having a voltage Vdd, and they output currents which are equal to each other. The constant-current sources 410-1, . . . , and 410-3 are disposed as a configuration which can be used in common in the respective analog voltage generating circuits. However, as described above, one constant-current source is used in common in two analog voltage generating circuits. By the way, it is not always necessary that the constant-current sources are equal to each other; for example, a weight of $2^k$ can also be applied to one or more of the current sources.

The decoder 401 decodes a two-phase digital input signal expressing a two-dimension signal (I, Q) inputted therein to a three-phase digital signal of a negative logic code. The decoder 401 converts the two-phase digital input signal so that the sum of three digital signal values to be outputted simultaneously is a substantially constant value.

The decoder 401 can be realized by a digital circuit which employs, for example, the equation (3).

One end of the resistor 441 is grounded; and, to the other end thereof, there is inputted a sum of currents that are outputted from drain terminals of the transistor 411 group. A potential difference between two ends of the resistor 441 provides an analog output signal OUTa of the first phase. And, one end of the resistor 442 is grounded; and, to the other end thereof, there is inputted a sum of currents that are outputted from drain terminals of the transistor 412 group. A potential difference between two ends of the resistor 442 provides an analog output signal OUTb of the second phase. Also, one end of the resistor 443 is grounded; and, to the other end thereof, there is inputted a sum of currents that are outputted from drain terminals of the transistor 413 group. A potential difference between two ends of the resistor 443 provides an analog output signal OUTc of the third phase. The resistance values of the resistors 441, 442 and 443 are set equal to each other.

The sum of currents, which is to be outputted from analog output terminals 451, 452 and 453 respectively provided on the other end sides of the resistors 441, 442 and 443, is always a substantially constant. Owing to this, currents, which flow to the respective grounded ends of the resistors 441, 442 and 443, cancel each other and thus these currents have no influence on other currents flowing in these three resistors. Therefore, the analog ground need not provide a low impedance; for example, it is not necessary to provide a buffer of a high driving ability for the analog ground.

As regards the analog output voltages, since the resistors 441, 442 and 443 are all equal in the resistance values thereof, similarly to the currents, the sum of the analog output voltages is a substantially constant, that is, as the same phase components of a signal, the sum of the voltages is substantially 0.

As described above, the present invention can also be enforced even when the output of the decoder 401 is set in a thermometer code.

By the way, according to the fourth embodiment as well, the decoder 401 can also be realized using a lookup table.

Also, as shown in FIG. 8, the constant-current source groups may also be arranged adjacently to each other physically in the order of numerals shown after "–".

Further, it goes without saying that other various means can also be used and the invention is not limited to the above embodiment.

Fifth Embodiment

Figure 9:
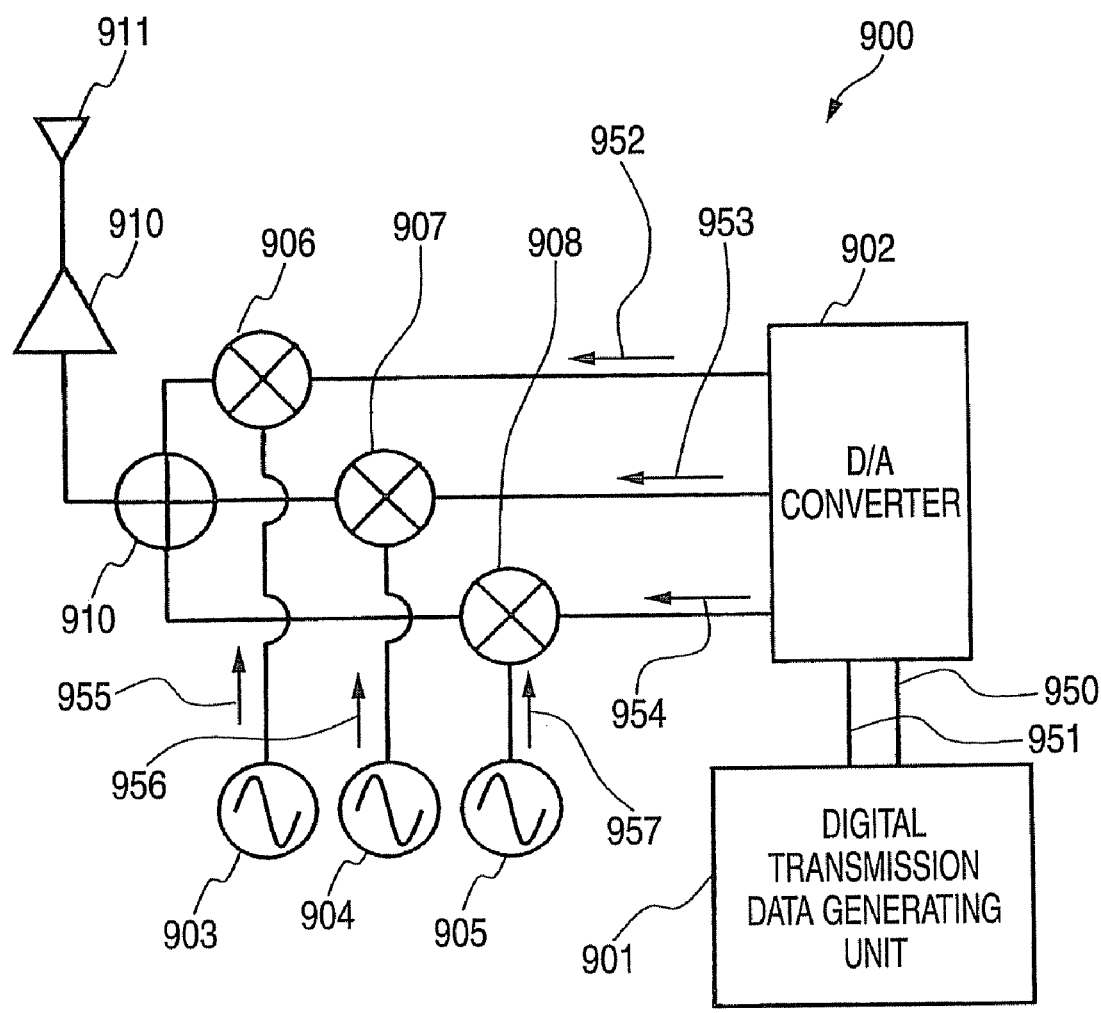
FIG. 9 is a block diagram of a transmitter according to a fifth embodiment of the invention.
Figure 10:
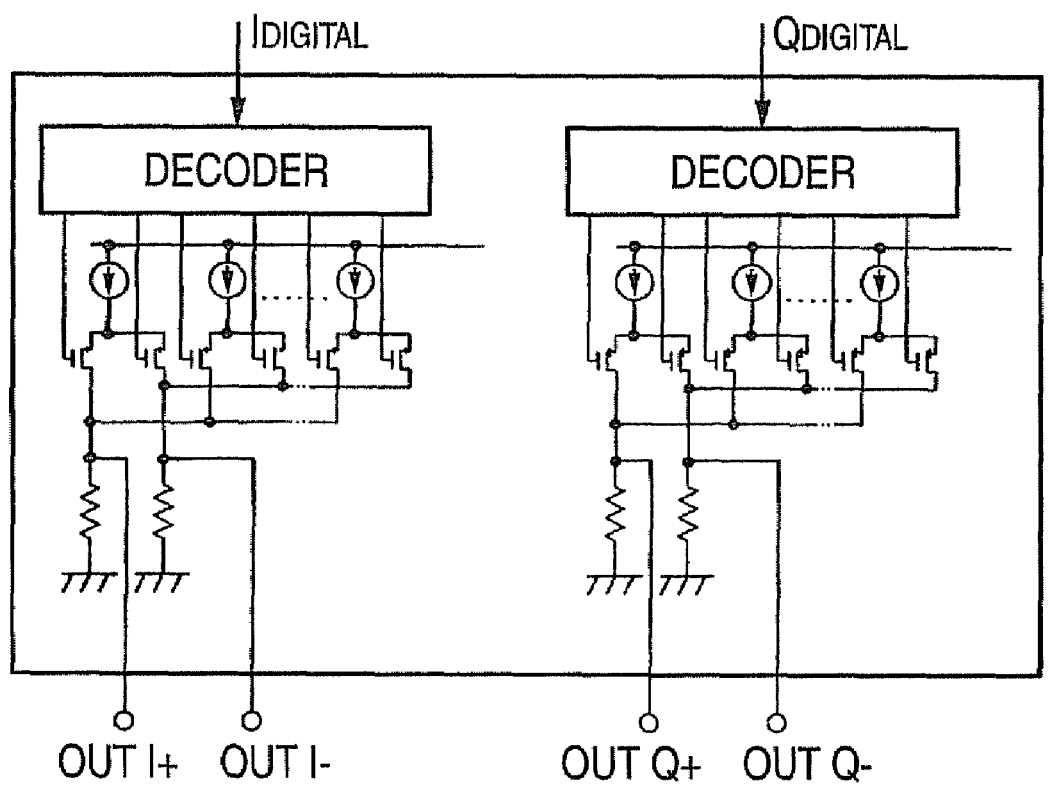
FIG. 10 is a circuit diagram of a conventional D/A converter.

FIG. 9 is a block diagram of a transmitter 900 including the output D/A converter with two-phase input three-phase according to the above-mentioned embodiments.

The transmitter 900 includes: a digital transmission data generating unit 901; a D/A converter 902; local signal generators 903, 904, 905; multipliers 906, 907, 908; an adder 909; a power amplifier 910; and an antenna 911.

The D/A converter 902 converts two-phase digital transmission data 950 and 951 of an I signal and a Q signal to be outputted from the digital transmission data generating unit 901 to three-phase analog signals 952, 953 and 954. Here, the I signal and Q signal are two-phase (two-dimensional) digital data in which information to be transmitted is expressed as complex signals.

As the D/A converter 902, there can be used the D/A converts 100, 200, 300 and 400 respectively according to the above-mentioned embodiments.

The local signal generator 903 oscillates a local signal (a local oscillation signal) 955 to be multiplied by the analog signal 952. The local signal generator 904 oscillates a local signal 956 shifted in phase by 120° in relation to the local signal 955. The local signal generator 905 oscillates a local signal 957 shifted in phase by 120° in relation to the local signal 955 in the reverse direction to the local signal 956. That is, phases of the local signals 955, 956, 957 are shifted by (⅔)π. Generally, when n is any integer, phases of local signals may be shifted by (2/n)π.

The multiplier 906 multiplies the analog signal 952 and local signal 955 and outputs the product thereof. The multiplier 907 multiplies the analog signal 953 and local signal 956 and outputs the product thereof. The multiplier 908 multiplies the analog signal 954 and local signal 957 and outputs the product thereof.

The adder 909 adds the outputs of the multipliers 906, 907 and 908, and outputs the sum thereof.

The power amplifier 910 amplifies the output of the adder 909.

The antenna 911 radiates the output of the adder 909 amplified by the power amplifier 910.

In the transmitter 900 according to the fifth embodiment, differently from a conventional transmitter which uses two one-phase input one-phase output D/A converters for an I signal and a Q signal, it is possible to reduce the deterioration of the accuracy of a complex signal caused by a matching error between the two D/A converters. Also, when compared with a transmitter using two D/A converters for I/Q, the number of transistors as well as the number of resistors can be theoretically reduced to ¾ and, therefore, the chip area and power consumption of the fifth embodiment can be reduced accordingly.

According to embodiments described above, a D/A converter controls the inconsistency of the analog conversion accuracy of a digital multi-dimensional signal such as a complex signal.

The present invention is not limited to the above embodiments as they are but, in the enforcing stage of the invention, the invention can be embodied while the composing elements thereof are changed or modified without departing from the subject matter of the invention. Also, when the two or more composing elements disclosed in the above-mentioned embodiments are properly combined together, there can be developed various inventions. For example, some of all the composing elements shown in the above-mentioned embodiments can also be removed. Also, the composing elements used in the different embodiments can also be properly combined together.

What is claimed is:

1. A digital/analog converter comprising:
a decoder that converts a (n−1)-phase input digital signal to a n-phase output digital signal, where n is an integer more than 1; and
a signal generating unit that generates analog signals according to the n-phase output digital signal, wherein the decoder converts the (n−1)-phase input digital signal to the n-phase output digital signal so that a sum of values of the analog signals generated by the signal generating unit is a substantially constant value.

2. The digital/analog converter according to claim 1, wherein the signal generating unit comprises n signal generating circuits that respectively generate the analog signals according to the n-phase output digital signal.

3. The digital/analog converter according to claim 2, wherein the n signal generating circuits are connected to a common power supply.

4. A digital/analog converter comprising:
a decoder that converts a two-phase input digital signal comprising a first-phase input digital signal and a second-phase input digital signal, to a three-phase output digital signal comprising a first-phase output digital signal, a second-phase output digital signal and a third-phase output digital signal, according to the following relationship:

$$\begin{bmatrix} a \\ b \\ c \end{bmatrix} = \frac{1}{3} \begin{bmatrix} 2 & 0 \\ -1 & \sqrt{3} \\ -1 & -\sqrt{3} \end{bmatrix} \begin{bmatrix} I \\ Q \end{bmatrix},$$

wherein a is the first-phase output digital signal, b is the second-phase output digital signal, c is the third-phase output digital signal, I is the first-phase input digital signal and Q is the second-phase input digital signal;
a signal generating unit that generates first to third analog signal according to the first to third-phase output digital signals.

5. The digital/analog converter according to claim 4, wherein the signal generating unit comprises:
a first signal generating circuit that generates the first analog signal according to the first-phase output digital signal;

a second signal generating circuit that generates the second analog signal according to the second-phase output digital signal; and a third signal generating circuit that generates the third analog signal according to the third-phase output digital signal.

6. The digital/analog converter according to claim 5, further comprising a plurality of current sources, wherein each of the first to third signal generating circuits comprises:

a resistor of which the corresponding analog signal is obtained as a potential difference between two ends; and a plurality of transistors that control flows of currents outputted from the current sources to the corresponding resistor according to the corresponding phase output digital signal.

7. The digital/analog converter according to claim 5, wherein the signal generating unit comprises a plurality of reference output terminals that output voltages, wherein successive output voltages differ by a unit voltage, wherein each of the first to third signal generating circuits comprise a output terminal and a plurality of switches, the switches being respectively connected to the reference output terminals, wherein one of the switches of each of the first to third signal generating circuits is turned on according to the corresponding phase output digital signal to obtain an output voltage at a reference output terminal connected to switch, which is turned on, at the corresponding output terminals.

8. The digital/analog converter according to claim 5, wherein the signal generating unit further comprises m constant-current sources that output currents, and wherein the first to third signal generating circuits comprise two transistors for each of the constant-current sources, and wherein each of the transistors controls a flow of the current from respective one of the constant-current sources to either one of first to third output terminals from which the first to third analog signals are respectively outputted.

9. A transmitter comprising:

a digital/analog converter comprising, a decoder that converts a (n−1)-phase input digital signal to a n-phase output digital signal, where n is an integer more than 1, and a signal generating unit that generates n analog signals according to the n-phase digital signal;

a local signal generator that generates n local signals with phases being shifted in relation to one another;

a multiplier that multiplies the n analog signals by the n local signals, respectively;

an adder that adds n outputs of the multiplier;

an amplifier that amplifies a signal from the adder; and an antenna that radiates the signal amplified by the amplifier.

10. A transmitter according to claim 9, wherein the signal generating unit comprises n signal generating circuits that respectively generate the analog signals according to the n-phase output digital signal.

11. The transmitter according to claim 9, wherein the decoder converts the (n−1)-phase input digital signal to the n-phase output digital signal so that a sum of values of the analog signals generated by the signal generating unit is a substantially constant value.

12. The transmitter according to claim 9, wherein the local signal generator that generates the n local signals with phases being shifted in relation to one another at least by $(2/n)\pi$.

* * * * *